(12) United States Patent
Suntken (10) Patent No.: US 12,355,469 B2
(45) Date of Patent: Jul. 8, 2025

(54) AMPLIFIER CIRCUIT TO ENABLE ACCURATE MEASUREMENT OF SMALL ELECTRICAL SIGNALS

(71) Applicant: INSIAVA (PTY) LTD., Pretoria (ZA)

(72) Inventor: Artur Wilhelm Suntken, Pretoria (ZA)

(73) Assignee: INSIAVA (PTY) LTD., Pretoria (ZA)

( * ) Notice: Subject to any disclaimer, the term of this patent is extended or adjusted under 35 U.S.C. 154(b) by 510 days.

(21) Appl. No.: 17/783,194

(22) PCT Filed: Nov. 12, 2020

(86) PCT No.: PCT/IB2020/060647
§ 371 (c)(1),
(2) Date: Jun. 7, 2022

(87) PCT Pub. No.: WO2021/116796
PCT Pub. Date: Jun. 17, 2021

(65) Prior Publication Data
US 2023/0016043 A1    Jan. 19, 2023

(30) Foreign Application Priority Data
Dec. 10, 2019   (NL) .................................. 2024414

(51) Int. Cl.
   *H03M 3/04*  (2006.01)
   *H03F 3/45*  (2006.01)
   *H03M 3/00*  (2006.01)

(52) U.S. Cl.
   CPC ........ *H03M 3/484* (2013.01); *H03F 3/45183* (2013.01); *H03F 3/45475* (2013.01);
   (Continued)

(58) Field of Classification Search
   CPC ...... H03M 3/484; H03M 1/765; H03M 3/464; H03M 3/424; H03M 1/129;
   (Continued)

(56) References Cited

U.S. PATENT DOCUMENTS

| 8,026,761 B2 * | 9/2011 | Nolan ................. H03F 3/45197 330/254 |
| 2018/0323748 A1 * | 11/2018 | Motoroiu ............ H03F 3/45672 |

OTHER PUBLICATIONS

Patent Cooperation Treaty, International Search Report and Written Opinion for PCT/IB2020/060647, 10 pages Dec. 21, 2020.

* cited by examiner

*Primary Examiner* — Andrea Lindgren Baltzell
*Assistant Examiner* — Jose E Pinero
(74) *Attorney, Agent, or Firm* — Bryan Cave Leigton Paisner LLP (57) ABSTRACT

An amplifier circuit includes a resistor divider ($R_{REF}$) comprising n resistive elements, two main nodes defined at each end thereof, two readout nodes ($d_1$, $d_2$), resistor nodes (q) defined between adjacent resistive elements, and an input current source ($I_{REF}$) connected or connectable to the first main node (a). The resistor divider ($R_{REF}$) comprises two arrays of addressable switch elements controllable by a feedback signal ($s_{FB}$) to be open or closed. The amplifier circuit includes a differential pair of transistors ($T_1$, $T_2$), wherein source terminals of each of the transistors ($T_1$, $T_2$) are connected to the second node (b), gate terminals of the transistors ($T_1$, $T_2$) are connected to input signals ($v_1$, $v_2$), drain terminals of the transistors ($T_1$, $T_2$) are connected to current sources ($I_1$, $I_2$), and bulk terminals of the transistors ($T_1$, $T_2$) are connected to the readout nodes ($d_1$, $d_2$). The amplifier circuit functions as a difference amplifier, wherein the bulk terminals affect a threshold of the respective transistors ($T_1$, $T_2$) so as to add or subtract a differential signal derived from the readout nodes ($d_1$, $d_2$) of the resistor divider ($R_{REF}$) determined by the feedback signal ($s_{FB}$).

18 Claims, 6 Drawing Sheets

(52) U.S. Cl.
CPC ............ *H03F 2203/45138* (2013.01); *H03F 2203/45631* (2013.01)

(58) Field of Classification Search
CPC ............ H03F 3/45183; H03F 3/45475; H03F 2203/45138; H03F 2203/45631; H03F 2200/264; H03F 2200/78; H03F 2203/45342; H03F 2203/45494; H03F 2203/45496; H03F 2203/45504; H03F 2203/45648; H03F 2203/45702; H03F 2203/45712; H03F 2203/45718
USPC ........................................................ 330/260
See application file for complete search history.

AMPLIFIER CIRCUIT TO ENABLE ACCURATE MEASUREMENT OF SMALL ELECTRICAL SIGNALS

FIELD OF INVENTION

This invention relates to an amplifier circuit and to a method to enable accurate measurement of small electrical signals, for example, those transduced or generated from sensors or sensor elements, including passive infrared (PIR) and thermopile sensors.

BACKGROUND OF INVENTION

Many sensors and transducers that convert physical quantities and parameters to electrical signals generate signals that are small and require sensitive instruments to detect. Often, such signals are associated with high output impedance from the sensors and transducers, charge build-up on the sensors themselves, operation in noisy environments and other circumstantial challenges that require additional care when interfacing and detecting these signals.

One example is in the field of thermal detection where thermopiles or pyro-ceramic elements are used in applications such as passive infrared (PIR) detection which often necessitate measurement of small voltages and currents from the sensor, preferably in a differential way, to ensure accurate read-out. The read-out of these small voltage and/or current signals should further not affect the normal operation of the sensing element. Conversion of these signals to a digital representation allows significant flexibility in processing these signals for decision-making and other purposes. If this conversion occurs early in the signal chain, environmental factors (e.g. RF coupling, supply variations, etc.) are less likely to affect the fidelity and accuracy of the signal.

The requirements for such a measurement device or instrument may include:
- the ability to operate in a differential manner and, where required to be able to operate in a single-ended way when, for example, the sensor does not have a differential output;
- the ability to work with input voltages above and below 0 V (symmetrical and asymmetrical);
- low noise contribution to ensure that the signal-to-noise ratio is maximised, since the measurement device is usually encountered early in the signal chain (which can affect all downstream systems);
- low power consumption operation that enables use in battery-operated devices and to ensure optimal use of energy;
- high dynamic range that will ensure accurate detection over a wide range of signals that may be generated by the sensor;
- enable conversion of analogue signals to digital signals for further processing as early as possible in the signal chain;
- high linearity;
- sufficient bandwidth to ensure accurate tracking of changes in the input signal as generated by the sensor; and
- robust implementation that will enable such a measurement device or instrument to be implemented in electronics of different natures, including discrete implementations, integrated circuits using CMOS or bipolar technologies, or any other implementation that may be feasible for a given application.

In prior art publication DE102013014810B4 a differential amplifier stage is described that satisfies a number of the abovementioned requirements. The publication discloses a digitally controlled string of serial resistors used to steer a constant reference current to either branch of a differential amplifier depending on a feedback signal that is generated as part of a sigma-delta analogue-to-digital converter (ADC). This feedback signal is essential to establish the function of a difference engine used as part of the sigma-delta converter architecture. One drawback of this approach is that the ultimate noise performance is limited by the resistor connected between the sources of the two transistors, specifically in cases where the value of the resistor is very high due to low current consumption requirements.

SUMMARY OF INVENTION

The invention provides an amplifier circuit which includes:
- a resistor divider ($R_{REF}$) comprising n resistive elements ($r_n$) in series where n>1, wherein:
  - the resistor divider ($R_{REF}$) comprises two main nodes defined at each end thereof, namely a first main node (a) and a second main node (b);
  - the resistor divider ($R_{REF}$) also comprises two readout nodes ($d_1$, $d_2$), namely a first readout node ($d_1$) and a second readout node ($d_2$);
  - the resistor divider ($R_{REF}$) comprises resistor nodes (q) defined between adjacent resistive elements;
  - an input current source ($I_{REF}$) is connected or connectable to the first main node (a);
  - the resistor divider ($R_{REF}$) comprises two arrays of addressable switch elements, with a first array of switch elements provided between the respective resistive nodes (q) of the resistive elements and the first readout node ($d_1$) and with a second array of switch elements provided between the respective resistive nodes (q) of the resistive elements and the second readout node ($d_2$); and
  - a state of the switch elements is controllable by a feedback signal ($s_{FB}$) to be open or closed, the resistive elements thus acting as selectable voltage taps with reference to the readout nodes ($d_1$, $d_2$);
- a differential pair of transistors ($T_1$, $T_2$) comprising a first transistor ($T_1$) having at least four terminals and a second transistor ($T_2$) having at least four terminals, wherein:
  - first terminals of each of the transistors ($T_1$, $T_2$) are connected to the second node (b);
  - second terminals of the transistors ($T_1$, $T_2$) are connected to respective input signals ($v_1$, $v_2$);
  - third terminals of the transistors ($T_1$, $T_2$) are connected to respective current sources ($I_1$, $I_2$), wherein a differential output signal ($v_{OUT}$) is created between the third terminals of the transistors ($T_1$, $T_2$); and
  - fourth terminals of the transistors ($T_1$, $T_2$) are connected to the respective readout nodes ($d_1$, $d_2$);
- wherein the amplifier circuit is configured to perform a function of a difference amplifier in that the transistors ($T_1$, $T_2$) form a differential amplifier with respective input signals ($v_1$, $v_2$) on their second terminals; and
- wherein the fourth terminals affect a threshold of the respective transistors ($T_1$, $T_2$) so as to add or subtract a differential signal derived from the readout nodes ($d_1$, $d_2$) of the resistor divider ($R_{REF}$) based on voltage signals generated by the operation of the resistor divider ($R_{REF}$) determined by the feedback signal ($s_{FB}$).

The input signals ($v_1$, $v_2$) may be derived from an external source. The external source may be a sensor.

The transistors ($T_1$, $T_2$) may be MOSFETs (Metal-Oxide-Semiconductor Field-Effect Transistors). The transistors ($T_1$, $T_2$) may be n-type MOSFETs or p-type MOSFETs.

The terminals of the transistors ($T_1$, $T_2$) may be as follows:
first terminal=source terminal;
second terminal=gate terminal;
third terminal=drain terminal; and/or
fourth terminal=bulk terminal.

The readout nodes ($d_1$, $d_2$) may be considered differential nodes. In other words, the signals at the readout nodes ($d_1$, $d_2$) may be a differential representation of the feedback signal ($s_{FB}$).

The amplifier circuit may be configured to perform a function of an integrator. The function of the integrator may be performed where the differential pair formed by the transistors ($T_1$, $T_2$), the current sources ($I_1$, $I_2$), and the nodal parasitic capacitances and resistances present on nodes connected to the third terminals of the respective transistors ($T_1$, $T_2$) and the operation of the amplifier circuit as a differential difference amplifier with respect to differential signals ($v_1$, $v_2$) and ($d_1$, $d_2$) may cause the differential output ($v_{OUT}$) to exhibit the characteristics of an integrated output. Additional capacitance may be added to the nodes connected to the third terminals of the respective transistors ($T_1$, $T_2$) to alter the integrator action.

The amplifier circuit may make use of the fourth terminal (e.g., the bulk terminal) of each transistor ($T_1$, $T_2$) to form a "second gate", that is, another terminal that affects the threshold voltage of each transistor. In other words, feedback in the form of the feedback signal ($s_{FB}$) may be applied directly to the transistors ($T_1$, $T_2$), effectively creating a differential difference amplifier for direct application in sigma-delta converters. Since the feedback signal ($s_{FB}$) may be a digital signal that controls the states (e.g., open or closed) of the switch elements, a polarity of the feedback signal ($s_{FB}$) may easily be controlled. In addition, and depending on the content and format of the feedback signal ($s_{FB}$), a correlation may exist between the voltage signals at the readout nodes ($d_1$, $d_2$) or these voltage signals may be independently controlled. In an example application, the voltage signals of the readout nodes ($d_1$, $d_2$) may change in opposite directions as part of an intended operation of the amplifier circuit.

The amplifier circuit may be configured to receive the respective input signals ($v_1$, $v_2$) from the sensor as:
differential signals, in a case where the sensor provides a differential output signal; or
a variable input signal and a fixed or ground input signal, in a case where the sensor only provides a single-ended output.

The respective input signals ($v_1$, $v_2$) may be respectively (relatively) negative and positive input signals ($v_{IN}$, $v_{IP}$). The negative input signal ($v_{IN}$) may be connected to the gate terminal of the first transistor ($T_1$) and the positive input signal ($v_{IP}$) may be connected to the gate terminal of the second transistor ($T_2$).

Differently stated, the resistor divider ($R_{REF}$) may be formed by a number of individual resistive elements ($r_n$) and switch elements that are configured in a way so as to provide two programmable voltage taps at the readout nodes ($d_1$, $d_2$) with addressable access to the nodes internal to the resistor divider ($R_{REF}$). From these voltage taps, the voltage signals at readout nodes ($d_1$, $d_2$) may be derived. As current flows through the resistor divider ($R_{REF}$), voltage division occurs throughout the individual resistive elements ($r_n$) so that discrete divisions of an entire voltage across $R_{REF}$ is accessible by the readout nodes ($d_1$, $d_2$) depending on the specific state (open or closed) of the switch elements as determined by the feedback signal ($s_{FB}$). It may therefore be possible to select a specific divided value of the voltage over the resistor divider ($R_{REF}$) through the readout nodes ($d_1$, $d_2$) with an appropriate application of the feedback signal ($s_{FB}$).

The amplifier circuit may form part of a sigma-delta ADC (analogue-to-digital converter). With this in mind, the transistors ($T_1$, $T_2$) may be configured to function as, or may form part of, a summation node. The resistor divider ($R_{REF}$) may be configured to function as, or may form part of, a DAC (Digital-to-Analogue Converter) that is used to provide a feedback signal to the differential pair that is necessary for the operation of a sigma-delta ADC. The current sources ($I_1$, $I_2$), with supporting circuitry, may be configured to function as, or may form part of, an integrator. The sigma-delta ADC may be considered to be a measurement circuit, of which the amplifier circuit described above forms part. Output of ADC may be given to feedback logic to create $S_{FB}$ to manipulate $R_{REF}$ taps $d_1$ and $d_2$ in order to create an analogue signal applied to the bulks of transistors $T_1$ and $T_2$, thereby allowing subtraction or addition of the feedback signal from the original ADC output.

The sigma-delta ADC may include a comparator. An input of the comparator may be connected to the differential output signal ($V_{OUT}$) of the amplifier circuit.

The sigma-delta ADC may include ADC (Analogue-to-Digital Converter) logic, e.g., decimation. An input of the ADC logic may be connected to an output of the comparator.

The sigma-delta ADC may include feedback logic. The feedback logic may be connected to the output of the ADC logic. The feedback logic may be configured to generate the feedback signal ($s_{FB}$). Output of the ADC may be $\log_2(n)$ bits.

The invention provides a method of operating an amplifier circuit, the method including:
providing a resistor divider ($R_{REF}$) comprising n resistive elements ($r_n$) in series where n>1, wherein:
the resistor divider ($R_{REF}$) comprises two main nodes defined at each end thereof, namely a first main node (a) and a second main node (b);
the resistor divider ($R_{REF}$) also comprises two readout nodes ($d_1$, $d_2$), namely a first readout node ($d_1$) and a second readout node ($d_2$);
the resistor divider ($R_{REF}$) comprises resistor nodes (q) defined between adjacent resistive elements;
an input current source ($I_{REF}$) is connected or connectable to the first main node (a);
the resistor divider ($R_{REF}$) comprises two arrays of switch elements which are addressable, with a first array of switch elements provided between the respective resistive nodes (q) of the resistive elements ($r_n$) and the first readout node ($d_1$) and with a second array of switch elements provided between the respective resistive nodes (q) of the resistive elements ($r_n$) and the second readout node ($d_2$); and
a state of the switch elements is controllable by a feedback signal ($s_{FB}$) to be open or closed, the resistive elements ($r_n$) thus acting as selectable voltage taps with reference to the readout nodes ($d_1$, $d_2$);
providing a differential pair of transistors ($T_1$, $T_2$) comprising a first transistor ($T_1$) having at least four terminals and a second transistor ($T_2$) having at least four terminals, wherein:

first terminals of each of the transistors ($T_1$, $T_2$) are connected to the second node (b);

second terminals of the transistors ($T_1$, $T_2$) are connected to respective input signals ($v_1$, $v_2$);

third terminals of the transistors ($T_1$, $T_2$) are connected to respective current sources ($I_1$, $I_2$), wherein a differential output signal ($v_{OUT}$) is created between the third terminals of the transistors ($T_1$, $T_2$); and fourth terminals of the transistors ($T_1$, $T_2$) are connected to the respective readout nodes ($d_1$, $d_2$);

performing, by the amplifier circuit, a function of a difference amplifier in that the transistors ($T_1$, $T_2$) form a differential amplifier with respective input signals ($v_1$, $v_2$) on their second terminals; and affecting, by the fourth terminals of the transistors ($T_1$, $T_2$), a transconductance of the respective transistors ($T_1$, $T_2$) so as to add or subtract a differential signal derived from the readout nodes ($d_1$, $d_2$) of the resistor divider ($R_{REF}$) based on voltage signals generated by the operation of the resistor divider ($R_{REF}$) determined by the feedback signal ($s_{FB}$).

BRIEF DESCRIPTION OF DRAWINGS

The invention will now be further described, by way of example, with reference to the accompanying diagrammatic drawings.

In the drawings.

DETAILED DESCRIPTION OF EXAMPLE EMBODIMENT

Figure 1:
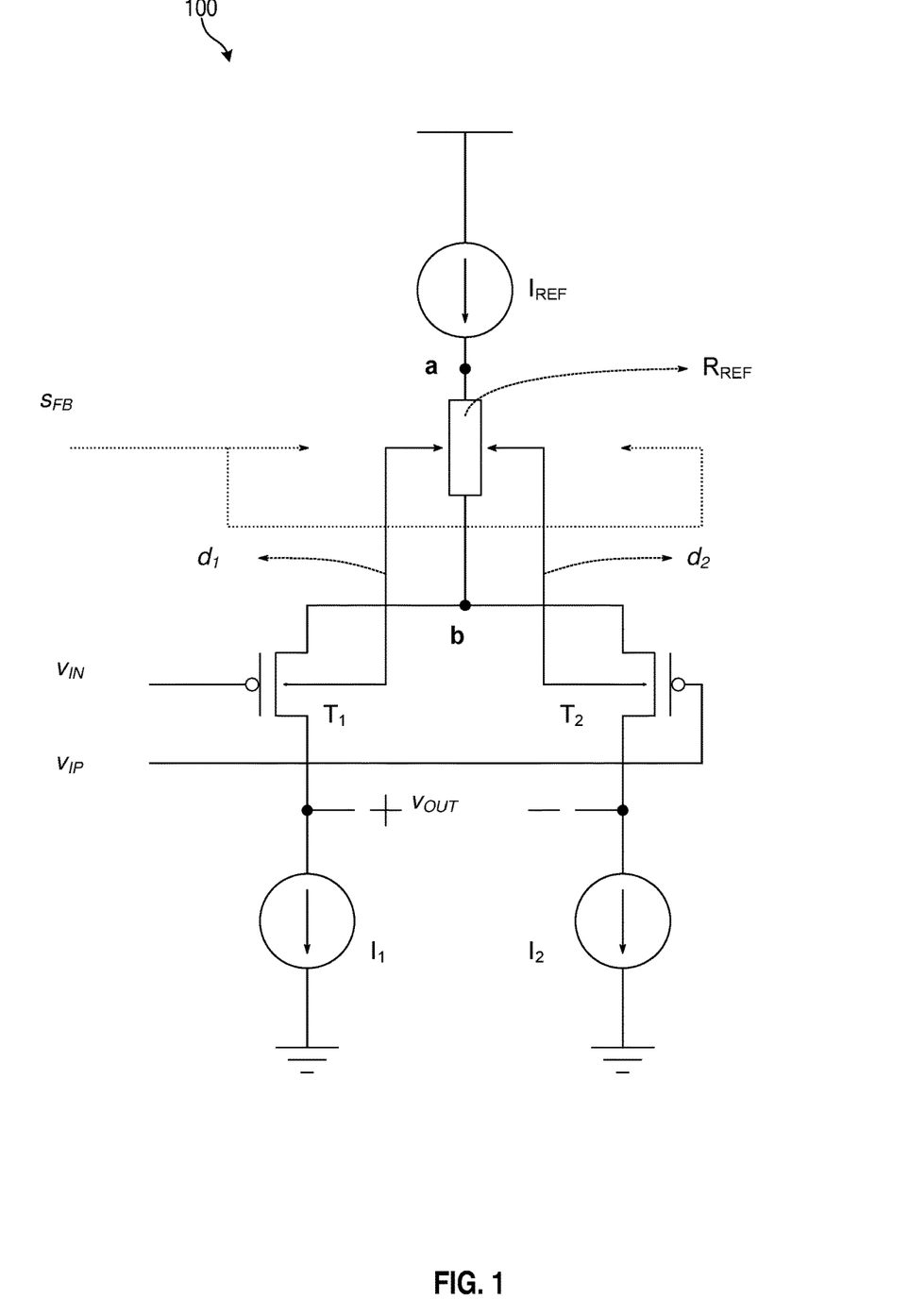
FIG. 1 shows a circuit diagram of an amplifier circuit, in accordance with the invention.

FIG. 1 illustrates an amplifier circuit 100 in accordance with the invention. The amplifier circuit 100 includes a resistor divider ($R_{REF}$) comprising n resistive elements in series where n>1. This resistor divider ($R_{REF}$) is illustrated in more detail in FIGS. 2 and 7-9. The resistor divider ($R_{REF}$) comprises two main nodes defined at each end thereof, namely a first main node (a) and a second main node (b). The resistor divider ($R_{REF}$) also comprises two readout nodes ($d_1$, $d_2$), namely a first readout node ($d_1$) and a second readout node ($d_2$). In this example configuration, the readout nodes ($d_1$, $d_2$) are differential and thus may be considered differential nodes ($d_1$, $d_2$).

An input current source ($I_{REF}$) is connected or connectable to the first main node (a). The input current source ($I_{REF}$) is constant, or near constant, and may be considered a biasing current source.

Figure 7:
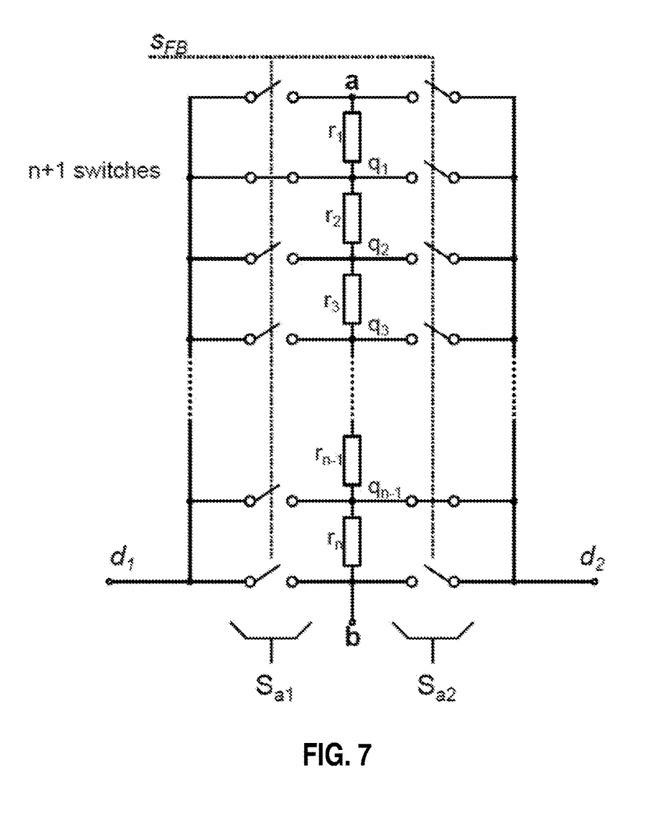
FIGS. 7-9 show circuit diagrams of alternative versions of the resistor divider of FIG. 2.
Figure 8:
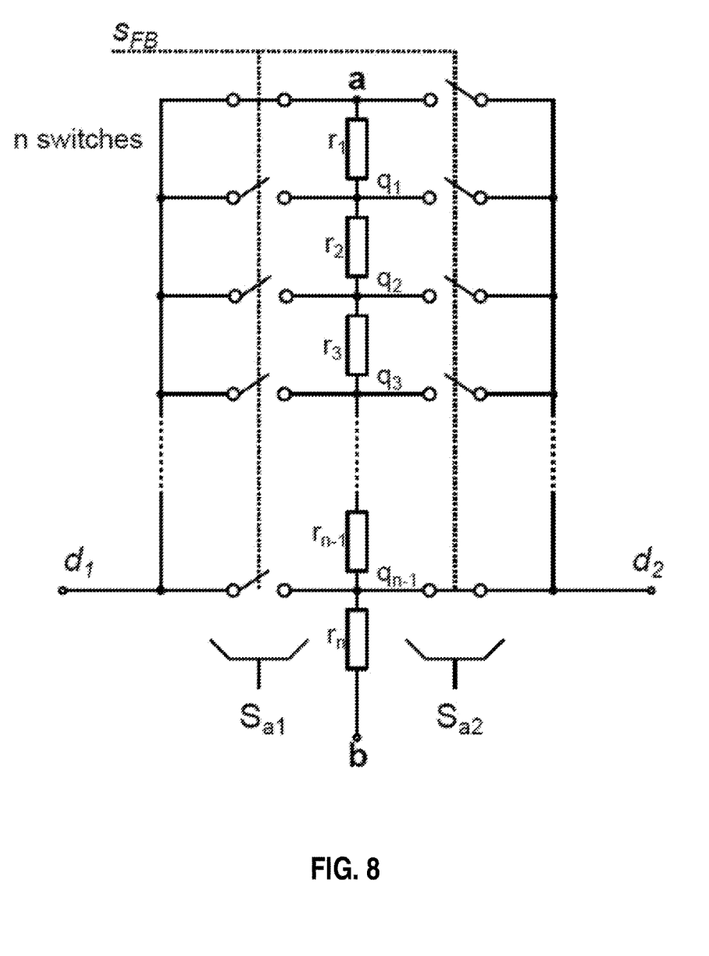
Figure 9:
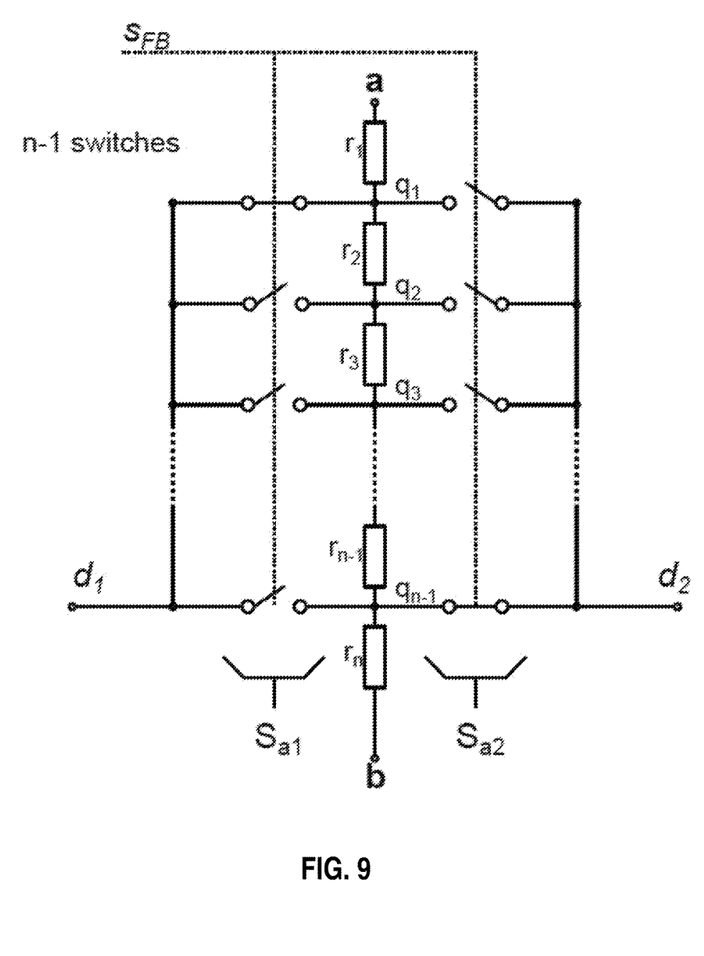

The resistor divider ($R_{REF}$) comprises resistor nodes (referred to by letter (q) in FIGS. 7-9) defined between adjacent resistive elements ($r_1 \ldots r_n$). The resistor divider ($R_{REF}$) comprises two arrays of switch elements ($S_{a1}$, $S_{a2}$) which are addressable, with the first array of switch elements ($S_{a1}$) provided between the respective resistive nodes (q) of the resistive elements ($r_1 \ldots r_n$) and the first readout node ($d_1$) and with a second array of switch elements ($S_{a2}$) provided between the respective resistive nodes (q) of the resistive elements ($r_1 \ldots r_n$) and the second readout node ($d_2$). A state of each of the switch elements ($S_{a1}$, $S_{a2}$) is individually controllable by a feedback signal ($s_{FB}$) to be open or closed, the resistive elements ($r_1 \ldots r_n$) thus acting as selectable voltage taps with reference to the readout nodes ($d_1$, $d_2$).

The amplifier circuit 100 has a differential pair of transistors ($T_1$, $T_2$) comprising a first transistor ($T_1$) and a second transistor ($T_2$). In this example, the transistors ($T_1$, $T_2$) are MOSFETs and each have four terminals as can typically be expected in a modern CMOS process. The amplifier circuit 100 has the terminals of the transistors ($T_1$, $T_2$) connected as follows:

first terminals—the source terminals, in this example configuration—of each of the transistors ($T_1$, $T_2$) are connected to the second node (b);

second terminals—the gate terminals, in this example configuration—of the transistors ($T_1$, $T_2$) are connected to respective input signals ($v_1$, $v_2$);

third terminals—the drain terminals, in this example configuration—of the transistors ($T_1$, $T_2$) are connected to respective current sources ($I_1$, $I_2$); and fourth terminals—the bulk terminals, in this example configuration—of the transistors ($T_1$, $T_2$) are connected to the respective readout nodes ($d_1$, $d_2$).

Accordingly, a differential output signal ($v_{OUT}$) is created between the drain terminals of the transistors ($T_1$, $T_2$) respectively having voltage levels labelled as $V_{OUT+}$ and $V_{OUT-}$. The amplifier circuit 100 is configured to perform a function of a difference amplifier in that the transistors ($T_1$, $T_2$) form a differential amplifier with respective input signals ($v_1$, $v_2$) on their gate terminals. The bulk terminals affect the threshold voltage of the respective transistors ($T_1$, $T_2$) so as to add or subtract a differential signal derived from the readout nodes ($d_1$, $d_2$) of the resistor divider ($R_{REF}$) based on voltage signals generated by the operation of the resistor divider ($R_{REF}$) determined by the feedback signal ($s_{FB}$).

Figure 2:
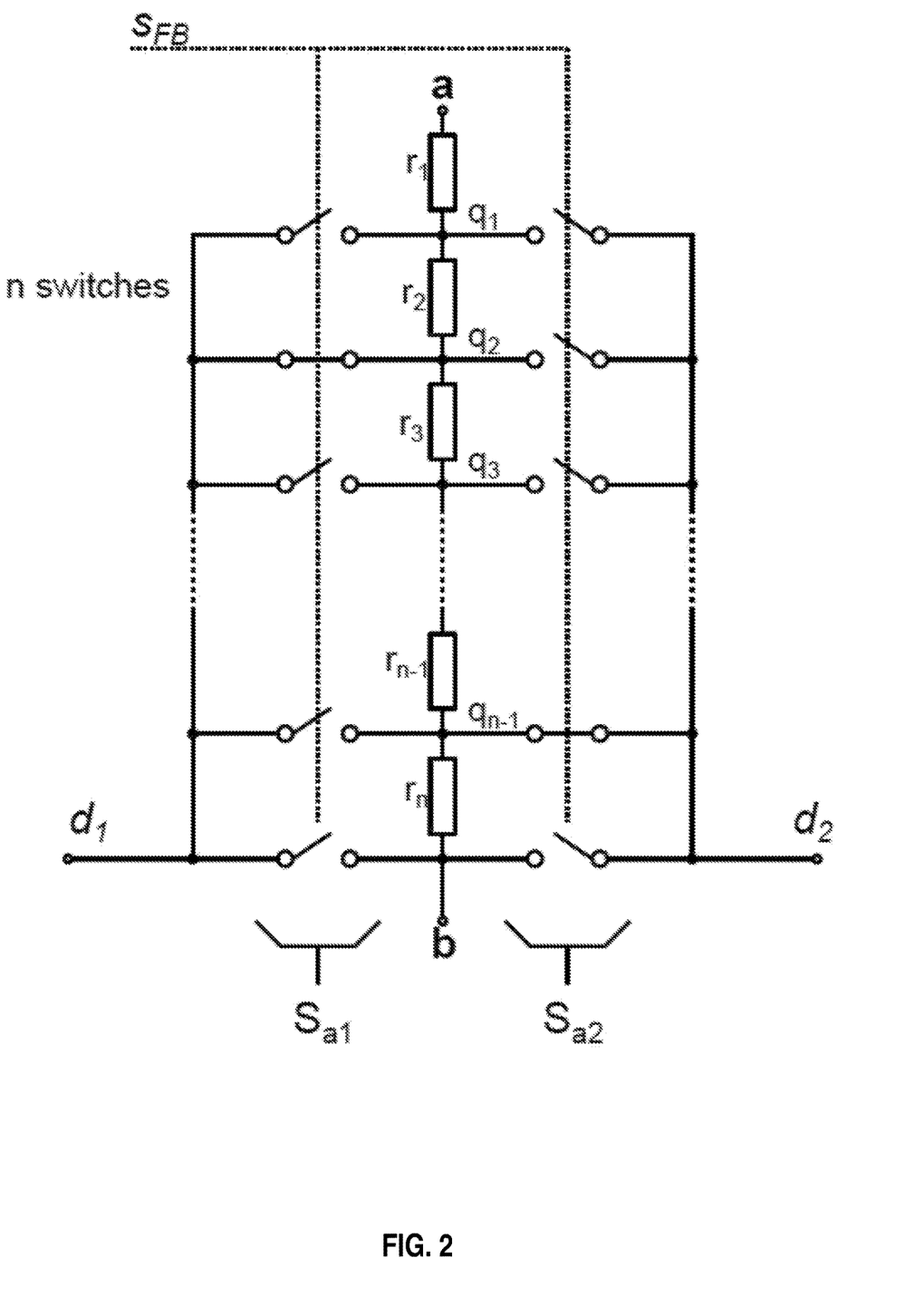
FIG. 2 shows a circuit diagram of a resistor divider of the amplifier circuit of FIG. 1.

The resistor divider ($R_{REF}$) is illustrated in further details in FIG. 2 (with variations being illustrated in FIGS. 7-9). The individual resistive elements ($r_1 \ldots r_n$) may be sized equally or unequally. The resistor nodes ($q_1 \ldots q_{n-1}$) are defined between adjacent resistors ($r_1 \ldots r_n$) with the main nodes a, b at each end. There are 2*n switch elements in this example, provided respectively between (1) the resistor nodes ($q_1 \ldots q_{n-1}$) and the second main node b and (2) the readout nodes ($d_1$, $d_2$). FIG. 7 illustrates an example in which there are 2*(n+1) switch elements. FIG. 8 illustrates an example in which a switch element is connected to the main node a (instead of the main node b) and FIG. 9 illustrates an example in which there are 2*(n−1) switch elements connected only to the resistor nodes ($q_1 \ldots q_{n-1}$) and not to the main nodes a, b.

Regardless of the precise configuration, the switch elements function as programmable voltage taps to connect the readout nodes ($d_1$, $d_2$) to selected individual resistive elements ($r_1 \ldots r_n$) based on the feedback signal ($s_{FB}$). From these voltage taps, two signals at the readout nodes ($d_1$, $d_2$) are derived. As current flows through the resistor divider ($R_{REF}$) string, voltage division occurs throughout the array of individual resistive elements so that discrete divisions of the entire voltage across the resistor divider ($R_{REF}$) is accessible by the two taps through the readout nodes ($d_1$, $d_2$) depending on the specific closure of switches as determined by the feedback signal ($S_{FB}$).

The input signals ($v_1$, $v_2$) may be derived from a sensor and may be specified as $v_{IN}$ and $v_{IP}$, and are connected to the gate terminals of the transistors ($T_1$, $T_2$) respectively. In the case where the sensor provides a differential output signal, the signals will be differential. In the case where the sensor only provides a single-ended output, one of these inputs will be grounded or connected to a fixed potential. The signals $v_{IN}$ and $v_{IP}$ may each be positive or negative with relation to a common reference, or one or both may be connected to such reference.

Figure 3:
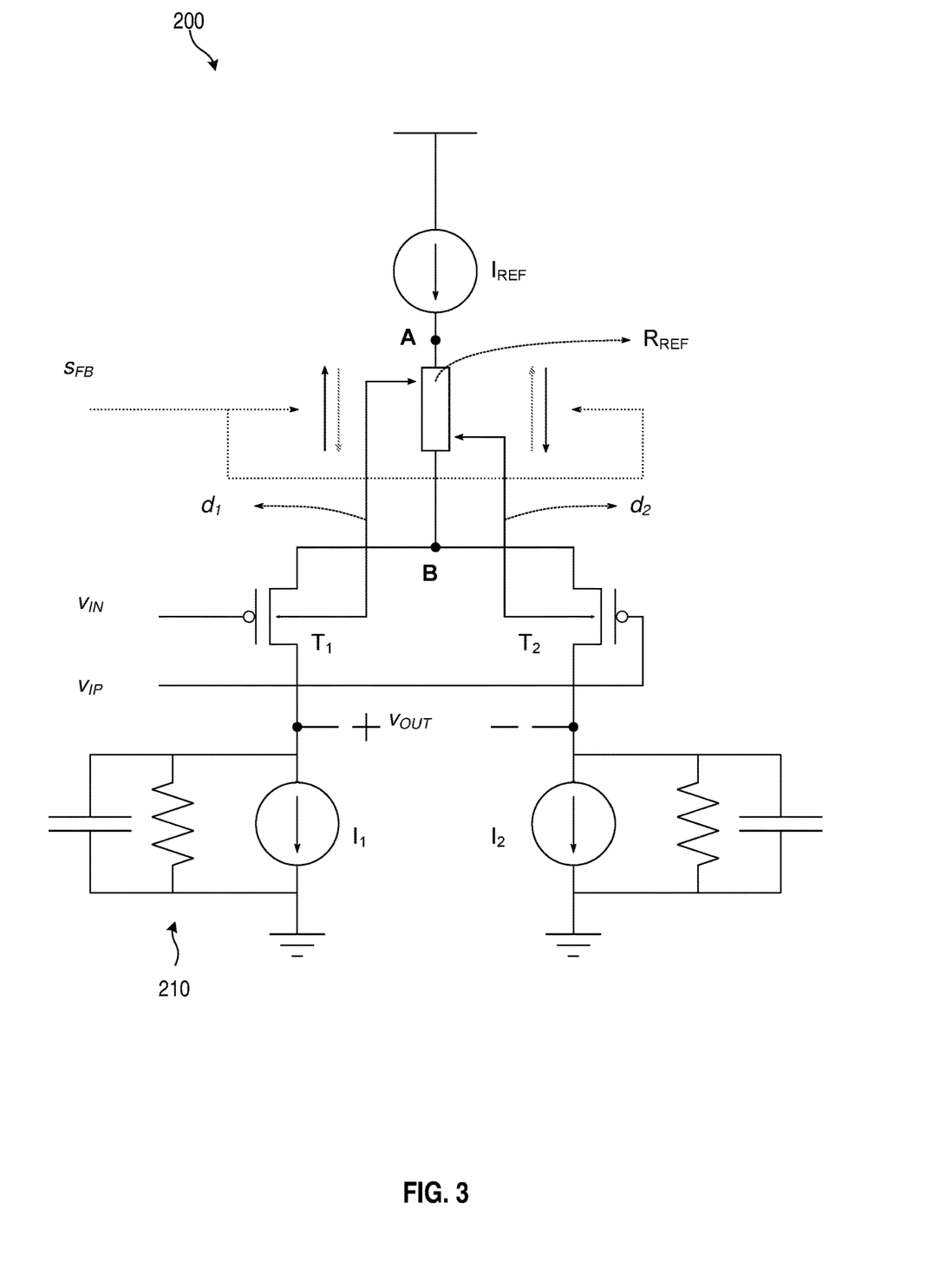
FIG. 3 shows a circuit diagram of a more detailed version of the amplifier circuit of FIG. 1.

With reference to FIG. 3, the circuit 200 performs the function of a difference amplifier and integrator, both functions that are required for the operation of a sigma-delta analogue-to-digital converter. An aspect of the present invention relates to the way in which the feedback signal ($s_{FB}$) is subtracted from the output signal ($v_{OUT}$) to give effect to the required difference function.

In a PRIOR ART circuit, where the bulk connections are connected to a constant potential, a tail current $I_{REF}$ will split equally between branch 1 and 2 when $v_{IN}=v_{IP}$. Any imbalance between $v_{IN}$ and $v_{IP}$ will cause a change in the transistor transconductances, thereby steering the tail current more to one branch. The transistor output impedance on the drain nodes are finite, as are the impedances associated with the current sources $I_1$ and $I_2$, thereby resulting in $v_{OUT}$ to be an amplified version of the imbalance between the inputs.

However, in the present invention, use is made of the bulk terminal of each transistor ($T_1$, $T_2$) to form a "second gate", that is, another terminal that affects the transconductance of each transistor ($T_1$, $T_2$). The bulk terminal of each transistor ($T_1$, $T_2$) is connected such that the bulk terminal of the first transistor ($T_1$) is connected to the signal from readout node ($d_1$) and the bulk terminal of the transistor ($T_2$) is connected to the signal from readout node ($d_2$).

Feedback can therefore be applied directly to the differential pair of transistors ($T_1$, $T_2$), effectively creating a differential difference amplifier for direct application in sigma-delta converters. Since the feedback signal ($s_{FB}$) is typically a digital signal that controls the states of the switch elements as per FIG. 2, a polarity of the feedback signal ($s_{FB}$) can easily be controlled. In addition, and depending on the content and format of the feedback signal ($s_{FB}$), a correlation can exist between signals of the readout nodes ($d_1$, $d_2$) or these signals can be independently controlled. In a typical application, signals of the readout nodes ($d_1$, $d_2$) will change in opposite directions as part of the intended operation of the amplifier circuit 100, 200.

The current sources $I_1$ and $I_2$, together with its parasitic resistances and capacitances, provide both gain and an integration function on the drains of the transistors ($T_1$, $T_2$). Additional capacitance 210 may be added on the drain terminals to alter and improve the integration function.

Figure 4:
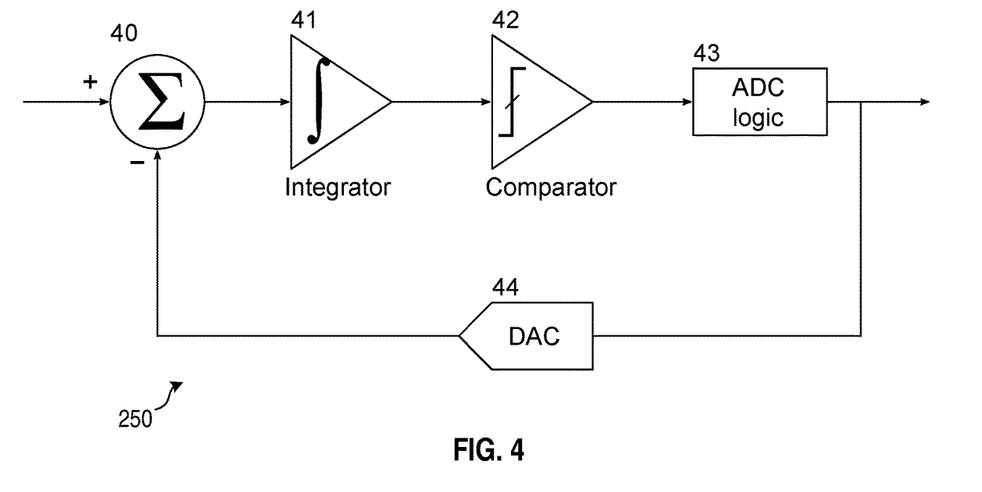
FIG. 4 shows a schematic diagram of a sigma-delta ADC of which the amplifier circuit of FIG. 1 may form part.

Since an application of the amplifier circuit 100, 200 is use as part of a sigma-delta analogue-to-digital converter, it may be necessary to interpret the individual functions of the circuit in this context. FIG. 4 shows a typical architecture, or functional block diagram, of a single- or multibit sigma-delta ADC 250. It is necessary to have a summation node (40) from which a feedback signal from a DAC is subtracted. The error signal is processed by an integrator (41) and sent to a comparator (42) for decision making. A digital circuit (ADC logic) (43) uses the comparator output signal to create a digital representation of the input signal. This representation is fed back through a digital-to-analogue converter (44) to the summation node to be subtracted from the current input signal. The approach, in general, is well known amongst persons skilled in the art.

Within this context, the amplifier circuit 100, 200 may combine the functions of the summation node (40), the integrator (41), and the DAC converter (44) in a unique and effective way. The subtraction function in the summation node (40) is performed using the differential pair of transistors ($T_1$, $T_2$) using the technique described above. The feedback signal ($s_{FB}$) is derived from the ADC output, while the DAC function (44) is performed by applying the feedback signal ($s_{FB}$) to the resistor divider ($R_{REF}$) and thereby generating the bulk voltages used by the differential pair of transistors ($T_1$, $T_2$) as part of the subtraction operation. Integration by the integrator (41) occurs on the drain terminals of the differential pair of transistors ($T_1$, $T_2$).

Figure 5:
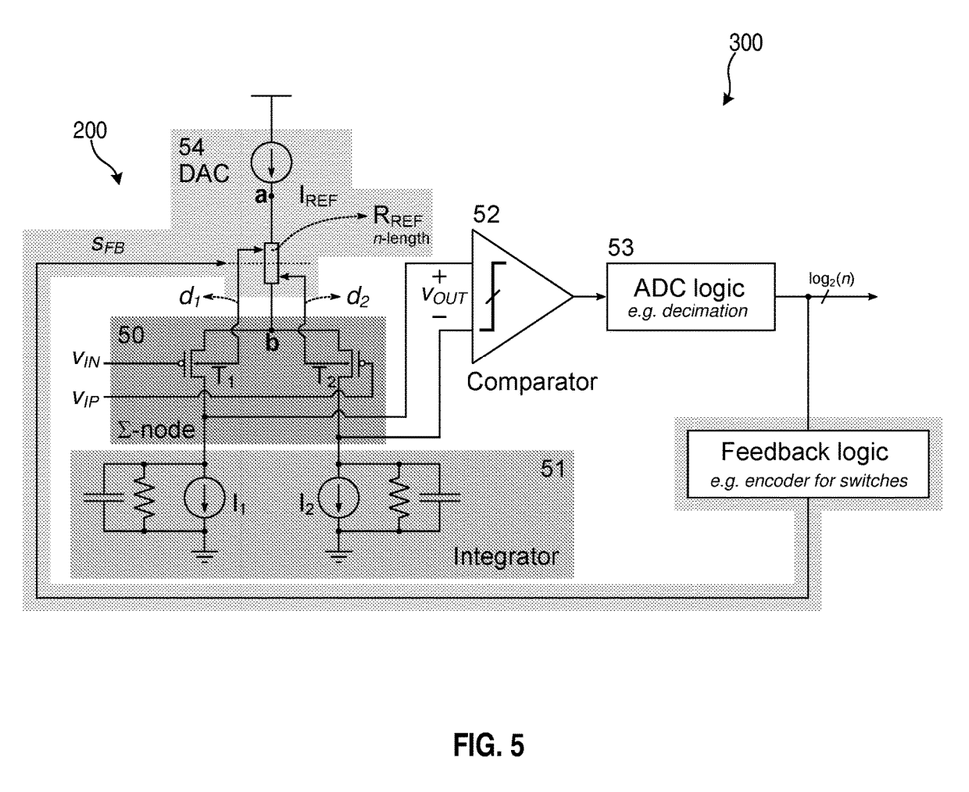
FIG. 5 shows a circuit and schematic diagram of a first embodiment of a more detailed version of the sigma-delta ADC of FIG. 4.

FIG. 5 illustrates a sigma-delta ADC 300 including the amplifier circuit 200. The differential pair of transistors ($T_1$, $T_2$) are PMOS transistors and accepts a differential input signal ($v_{IN}-v_{IP}$) and signals from differential readout nodes ($d_1$, $d_2$) generated by the DAC function (54) to thereby subtract feedback from the input through operation by the differential pair (50). The differential output signal ($v_{OUT}$) represents an integrated version, by virtue of the nodal characteristics of the integrator (50), of the difference signal and is then passed to a comparator (52) and fed to ADC logic (53) which converts the single bit comparator output signal to a multi-bit signal. The ADC output is encoded by the feedback logic, part of the DAC (54), to generate the appropriate feedback signal ($s_{FB}$) to be applied to the resistor divider ($R_{REF}$) in selecting the feedback taps, thereby generating signals at the readout nodes ($d_1$, $d_2$) and closing the feedback loop.

In this example shown in FIG. 5, where operation is fully differential, the signals at the readout nodes ($d_1$, $d_2$) will move symmetrically in opposite directions. That is, if $d_1$ increases, $d_2$ will decrease with the same proportion. If the implementation is a multi-bit implementation, a relationship between the ADC output and the number of elements in the reference resistor will exist as shown in FIG. 6.

In another version of the measurement device, the circuit may comprise NMOS transistors of opposite polarity forming the differential pair and in which the polarity and position of the current source ($I_{REF}$) and reference resistor ($R_{REF}$) are adapted accordingly to provide the same function to the circuit. In fact, any field-effect transistor where the bulk or body terminal can act as a second input to control transconductance can be used.

Figure 6:
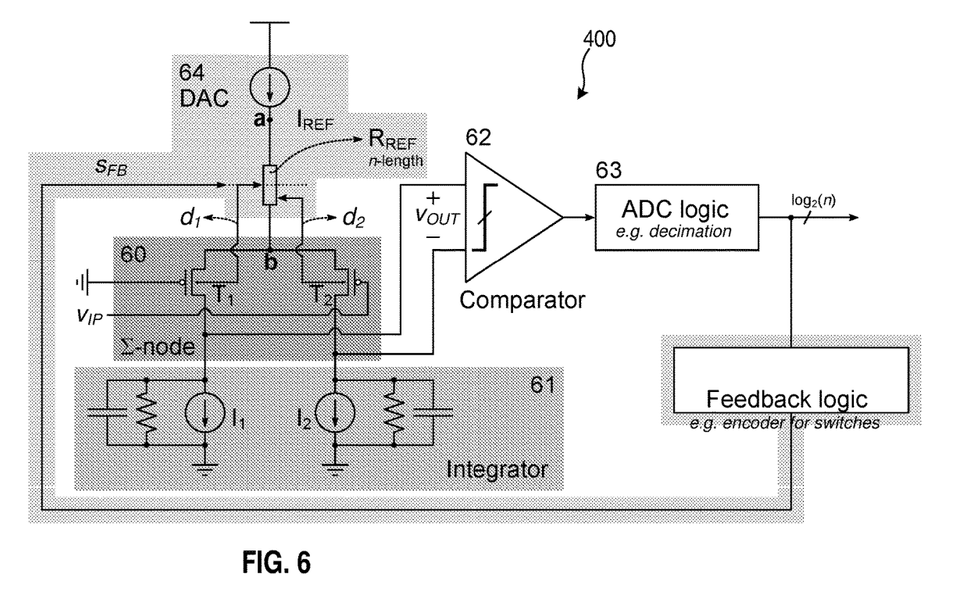
FIG. 6 shows a circuit and schematic diagram of a second embodiment of a more detailed version of the sigma-delta ADC of FIG. 4.

FIG. 6 illustrates another version of the sigma-delta ADC 400, in which the amplifier circuit 200 may accept a single-ended input where one input is, for example, grounded and the signal is applied to the other input. Either input may be grounded while the other input accepts positive and negative input signals.

The sigma-delta ADC 300, 400 may be considered a measurement circuit or a measurement device. The amplifier circuit 100, 200 and/or the sigma-delta ADC 300, 400 may be, or may be part of, an integrated circuit.

This invention as exemplified constitutes an approach to measure a physical parameter, such as temperature, radiation, thermal signature or the like from a signal generated by a sensor that senses such parameter. A novel approach is used to create the difference function between a differential, but possible single-ended, input signal from the sensor and a feedback signal, typically in digital form, that must be subtracted from the input signal as part of the sigma-delta analogue-to-digital converter while adhering to the requirements for such a measurement device as mentioned earlier. The power consumption is minimised as the reference current is also used as the operating current for the differential amplifier.

The device can be applied generally in a number of applications, but implementation is primarily aimed at integrated semiconductor circuits and devices. The device can be fabricated using cost-effective, industry standard manufacturing processes such as silicon-based CMOS (complementary metal-oxide-semiconductor). The device finds use in sensor applications, for example in read-out circuits of passive infrared (PIR) sensors, thermopiles and other sensors wherever the measurement and discretisation of input signals are required over a relatively wide dynamic range.

By constructing an amplifier circuit 100, 200 as described, or a measurement device 300, 400 comprising the amplifier circuit 100, 200, some or all of the requirements listed in the BACKGROUND OF INVENTION can be attained. Furthermore, the novel amplifier circuit 100, 200 or measurement device 300, 400 disclosed herein may achieve distinct advantages over the prior art, for example lower noise operation and additional degrees of freedom in controlling the feedback signal.

What is claimed is:

1. An amplifier circuit which includes:
  a resistor divider ($R_{REF}$) comprising n resistive elements ($r_n$) in series where n>1, wherein:
  the resistor divider ($R_{REF}$) comprises two main nodes defined at each end thereof, namely a first main node (a) and a second main node (b);
  the resistor divider ($R_{REF}$) also comprises two readout nodes ($d_1$, $d_2$), namely a first readout node ($d_1$) and a second readout node ($d_2$);
  the resistor divider ($R_{REF}$) comprises resistor nodes (q) defined between adjacent resistive elements;
  an input current source ($I_{REF}$) is connected to the first main node (a);
  the resistor divider ($R_{REF}$) comprises two arrays of addressable switch elements, with a first array of switch elements provided between the respective resistive nodes (q) of the resistor divider ($R_{REF}$) and the first readout node ($d_1$) and with a second array of switch elements provided between the respective resistive nodes (q) of the resistor divider ($R_{REF}$) and the second readout node ($d_2$); and
  a state of the switch elements is controlled by a feedback signal ($s_{FB}$) to be open or closed, the readout nodes ($d_1$, $d_2$) thus acting as selectable voltage taps connected to the resistive elements;
  a differential pair of transistors ($T_1$, $T_2$) comprising a first transistor ($T_1$) having at least four terminals and a second transistor ($T_2$) having at least four terminals, wherein:
  source terminals of each of the transistors ($T_1$, $T_2$) are connected to the second main node (b);
  gate terminals of the transistors ($T_1$, $T_2$) are connected to respective input signals ($V_1$, $V_2$);
  drain terminals of the transistors ($T_1$, $T_2$) are connected to respective current sources ($I_1$, $I_2$), wherein a differential output signal ($V_{OUT}$) is created between the drain terminals of the transistors ($T_1$, $T_2$) ; and
  bulk terminals of the transistors ($T_1$, $T_2$) are connected to the respective readout nodes ($d_1$, $d_2$), wherein a bulk terminal of the first transistor ($T_1$) is connected to the first readout node ($d_1$) and a bulk terminal of the second transistor ($T_2$) is connected to the second readout node ($d_2$);
  wherein the amplifier circuit is configured to perform a function of a difference amplifier in that the transistors ($T_1$, $T_2$) form a differential amplifier with the respective input signals ($V_1$, $V_2$) on their gate terminals; and
  wherein the bulk terminals are configured to function as secondary gates in that the bulk terminals affect a threshold of the respective transistors ($T_1$, $T_2$) so as to add or subtract a differential signal derived from the readout nodes ($d_1$, $d_2$) of the resistor divider ($R_{REF}$) based on voltage signals generated by the operation of the resistor divider ($R_{REF}$) determined by the feedback signal ($S_{FB}$).

2. The amplifier circuit as claimed in claim 1, in which the gate terminals of the transistors ($T_1$, $T_2$) are connected to a sensor and the respective input signals ($V_1$, $V_2$) are derived from the sensor.

3. The amplifier circuit as claimed in claim 1, in which the transistors ($T_1$, $T_2$) are MOSFETs (Metal-Oxide-Semiconductor Field-Effect Transistors).

4. The amplifier circuit as claimed in claim 1, in which the readout nodes ($d_1$, $d_2$) are differential nodes and signals at the readout nodes ($d_1$, $d_2$) are a differential representation of the feedback signal ($S_{FB}$).

5. The amplifier circuit as claimed in claim 1, which is configured to perform a function of an integrator where the differential pair formed by the transistors ($T_1$, $T_2$), the current sources ($I_1$, $I_2$), nodal parasitic capacitances and resistances present on nodes connected to the drain terminals of the respective transistors ($T_1$, $T_2$), and the operation of the amplifier circuit as a differential difference amplifier with respect to differential signals ($V_1$, $V_2$) and ($d_1$, $d_2$) causes the differential output ($V_{OUT}$) to exhibit characteristics of an integrated output.

6. The amplifier circuit as claimed in claim 5, in which capacitors are added to the nodes connected to the drain terminals of the respective transistors ($T_1$, $T_2$) to alter integrator action.

7. The amplifier circuit as claimed in claim 6, in which feedback in the form of the feedback signal ($S_{FB}$) is applied directly to the transistors ($T_1$, $T_2$), effectively creating a differential amplifier for direct application in sigma-delta converters.

8. The amplifier circuit as claimed in claim 1, which is configured to receive the respective input signals ($V_1$, $V_2$):
  differential signals;
  or a variable input signal and a fixed or ground input signal.

9. The amplifier circuit as claimed in claim 1, which is, or which forms part of, an integrated circuit.

10. A sigma-delta analogue-to-digital converter which includes the amplifier circuit as claimed in claim 1.

11. The sigma-delta analogue-to-digital converter as claimed in claim 10, which includes a summation node and in which the transistors ($T_1$, $T_2$) are configured to function as, or forms part of, the summation node.

12. The sigma-delta analogue-to-digital converter as claimed in claim 10, which includes a DAC (Digital-to-Analogue Converter) and in which the resistor divider ($R_{REF}$) is configured to function as, or forms part of, the DAC.

13. The sigma-delta analogue-to-digital converter as claimed in claim 10, which includes an integrator and in which the current sources ($I_1$, $I_2$), with supporting circuitry, are configured to function as, or forms part of, are integrator.

14. The sigma-delta analogue-to-digital converter as claimed in claim 10, which includes a comparator and in which an input of the comparator is connected to the differential output signal ($V_{OUT}$) of the amplifier circuit.

15. The sigma-delta analogue-to-digital converter as claimed in claim 14, which includes ADC (Analogue-to-Digital Converter) logic and in which an input of the ADC logic is connected to an output of the comparator.

16. The sigma-delta analogue-to-digital converter as claimed in claim 15, which includes feedback logic which is connected to an output of the ADC logic and which is configured to generate the feedback signal ($S_{FB}$).

17. The sigma-delta analogue-to-digital converter as claimed in claim 10, which is, or which forms part of, an integrated circuit.

18. A method of operating an amplifier circuit, the method including:
- providing a resistor divider ($R_{REF}$) comprising n resistive elements ($r_n$) in series where n>1, wherein:
- the resistor divider ($R_{REF}$) comprises two main nodes defined at each end thereof, namely a first main node (a) and a second main node (b);
- the resistor divider ($R_{REF}$) also comprises two readout nodes ($d_1$, $d_2$), namely a first readout node ($d_1$) and a second readout node ($d_2$) ;
- the resistor divider ($R_{REF}$) comprises resistor nodes (q) defined between adjacent resistive elements;
- an input current source ($I_{REF}$) is connected to the first main node (a);
- the resistor divider ($R_{REF}$) comprises two arrays of addressable switch elements, with a first array of switch elements provided between the respective resistive nodes (q) of the resistor divider ($R_{REF}$) and the first readout node ($d_1$) and with a second array of switch elements provided between the respective resistive nodes (q) of the resistor divider ($R_{REF}$) and the second readout node ($d_2$); and
- a state of the switch elements is controlled by a feedback signal (SFB) to be open or closed, the readout nodes ($d_1$, $d_2$) thus acting as selectable voltage taps connected to the resistive elements ($r_n$);
- providing a differential pair of transistors ($T_1$, $T_2$) comprising a first transistor ($T_1$) having at least four terminals and a second transistor ($T_2$) having at least four terminals, wherein:
- source terminals of each of the transistors ($T_1$, $T_2$) are connected to the second main node (b);
- gate terminals of the transistors ($T_1$, $T_2$) are connected to respective input signals ($v_1$, $V_2$);
- drain terminals of the transistors ($T_1$, $T_2$) are connected to respective current sources ($I_1$, $I_2$), wherein a differential output signal ($V_{OUT}$) is created between the drain terminals of the transistors ($T_1$, $T_2$) ; and
- bulk terminals of the transistors ($T_1$, $T_2$) are connected to the respective readout nodes ($d_1$, $d_2$), wherein a bulk terminal of the first transistor ($T_1$) is connected to the first readout node ($d_1$) and a bulk terminal of the second transistor ($T_2$) is connected to the second readout node ($d_2$);
- performing, by the amplifier circuit, a function of a difference amplifier in that the transistors ($T_1$, $T_2$) form a differential amplifier with the respective input signals ($V_1$, $V_2$) on their gate terminals; and
- affecting, by the bulk terminals of the transistors ($T_1$, $T_2$) , a transconductance of the respective transistors ($T_1$, $T_2$) so as to add or subtract a differential signal derived from the readout nodes ($d_1$, $d_2$) of the resistor divider ($R_{REF}$) based on voltage signals generated by the operation of the resistor divider ($R_{REF}$) determined by the feedback signal ($S_{FB}$), the bulk terminals thereby being configured to function as secondary gates.

* * * * *